(12) United States Patent
Berman et al.

(10) Patent No.: US 11,855,658 B1
(45) Date of Patent: Dec. 26, 2023

(54) EFFICIENT HARD DECISION DECODING OF GENERALIZED REED-SOLOMON CODES IN PRESENCE OF ERASURES AND ERRORS WITHIN THE SINGLETON BOUND

(71) Applicant: SAMSUNG ELECTRONICS CO., LTD., Suwon-si (KR)

(72) Inventors: Amit Berman, Suwon-si (KR); Avner Dor, Suwon-si (KR); Yaron Shany, Suwon-si (KR); Ilya Shapir, Suwon-si (KR); Ariel Doubchak, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/882,306

(22) Filed: Aug. 5, 2022

(51) Int. Cl.
    *H03M 13/00* (2006.01)
    *H03M 13/15* (2006.01)
    *H03M 13/11* (2006.01)

(52) U.S. Cl.
    CPC ... *H03M 13/1515* (2013.01); *H03M 13/1108* (2013.01); *H03M 13/1545* (2013.01); *H03M 13/1575* (2013.01)

(58) Field of Classification Search
    CPC ......... H03M 13/1515; H03M 13/1545; H03M 13/1575; H03M 13/373; H03M 13/293; H03M 13/1525; H03M 13/25; H04L 1/0057; G06F 11/1004
    See application file for complete search history.

(56) References Cited

U.S. PATENT DOCUMENTS

| | | | | |
|---|---|---|---|---|
| 7,539,927 | B2 * | 5/2009 | Lee | H03M 13/1545 714/784 |
| 8,209,589 | B2 * | 6/2012 | Andreev | H03M 13/1515 714/784 |
| 9,166,623 | B1 * | 10/2015 | Bates | H03M 13/1555 |
| 9,191,029 | B2 * | 11/2015 | Fredrickson | H03M 13/616 |
| 9,680,509 | B2 * | 6/2017 | Kwok | G06F 11/1012 |
| 10,567,003 | B2 * | 2/2020 | Brueggen | H03M 13/6561 |
| 11,146,293 | B2 * | 10/2021 | Stanisavljevic | H03M 13/153 |
| 2009/0070656 | A1 | 3/2009 | Jo et al. | |

\* cited by examiner

*Primary Examiner* — Esaw T Abraham
(74) *Attorney, Agent, or Firm* — Fish & Richardson P.C.

(57) ABSTRACT

A processing circuit is configured to: construct a first locator polynomial for a Reed-Solomon codeword to identify locations of erasures in the Reed-Solomon codeword; determine a first syndrome of the Reed-Solomon codeword; calculate a first error evaluator polynomial from the first syndrome and the first locator polynomial; and perform error detection based on the first error evaluator polynomial to determine presence of errors in the Reed-Solomon codeword. When presence of errors in the Reed-Solomon codeword is not detected in the error detection, the processing circuit bypasses updating the first locator polynomial and proceeds to completing decoding of the Reed-Solomon codeword, but when presence of errors in the Reed-Solomon codeword is detected in the error detection, the system first updates the first locator polynomial to a second locator polynomial in a process with reduced complexity compared to the common one, before completing decoding of the Reed-Solomon codeword.

20 Claims, 5 Drawing Sheets

EFFICIENT HARD DECISION DECODING OF GENERALIZED REED-SOLOMON CODES IN PRESENCE OF ERASURES AND ERRORS WITHIN THE SINGLETON BOUND

BACKGROUND

GRS (generalized Reed-Solomon) codewords are used in many error correction applications. A GRS codeword includes multiple symbols, and each symbol includes multiple bits. Encoded GRS codewords may be transmitted through channels that introduce two types of noise, i.e., erasures E0 and errors E1. A transmitted GRS codeword C may be transmitted without noise, whereas the received GRS codeword R may be received with noise including the erasures E0 and the errors E1. Some ECC (error correction code) schemes use GRS codewords to correct both erasures E0 and errors E1.

A typical decoder flow consists of first constructing an initial erasure locator polynomial (ELP) Λ0 for the GRS codeword, which contains information of numbers of and locations of erasures E0 in the GRS codeword, and calculating the syndrome S(x) of the GRS codeword, which contains information of numbers of and locations of errors E1 in the GRS codeword. At this stage, the number and locations of erasures are already known from the initial ELP Λ0, and the degree of the initial ELP Λ0 equals the number of erasures E0. However, the numbers of and locations of errors E1 in the GRS codeword are not yet known at this stage. Second, the initial ELP Λ0 is updated to an auxiliary ELP Λ(x) by applying the Berlekamp-Massey (BM) algorithm to the initial ELP Λ0 and the syndrome S(x). The BM algorithm is applied repeatedly, and the degree of the auxiliary ELP Λ(x) throughout the processing by the BM algorithm starts at the number of erasures E0 and increases if there are errors E1. At the end of applying the BM algorithm, the degree of the auxiliary ELP Λ(x) equals the sum of the number of erasures E0 and the number of errors E1 in the GRS codeword, so the number of errors E1 is known after this stage. Third, a determination is made whether the application of the BM algorithm to update the initial ELP AO has failed, such as if too many erasures E0 and/or errors E1 are identified from the auxiliary ELP Λ(x). Excessive erasures E0 and/or errors E1 may be determined if the Singleton bound does not hold. The Singleton bound requires 2E1+E0≤D−1, wherein D relates to a minimum distance from (radius around) a transmitted codeword C in which a received codeword R is expected to be corrected to the codeword C. Fourth, if application of the BM algorithm has not failed, a Chien search (CS) algorithm is applied to the auxiliary ELP Λ(x) to find the locations of the errors E1 by finding zeros in the auxiliary ELP Λ(x) as different values for the variable x are progressively filled in to the auxiliary ELP Λ(x). After the Chien search, numbers and locations of both the erasures E0 and errors E1 are known. Fifth, after the Chien search, a determination is made whether the decoding fails (which will usually occur if the codeword is still too noisy and the Singleton bound does not hold). Sixth, if the decoding does not fail, an Error and Erasure Evaluator polynomial (EEP) Γ(x) is constructed using the auxiliary ELP Λ(x) and the syndrome S(x). Seventh, the erasure E0 values and the error E1 values are estimated via the Forney algorithm using the EEP Γ(x), the auxiliary ELP Λ(x), and the known numbers and locations of both the erasures E0 and the errors E1. Processing in the typical decoder flow is performed on a full set of frames in order for a GRS codeword, and the hardware blocks are arranged in order so as to process full sets of frames in order for each GRS codeword.

A variety of inefficiencies exist with the typical decoder flow described above. For example, the number of erasures E0 is often considerably larger than the number of errors E1. As a result, the repeated application of the BM algorithm is often inefficient because the number and locations of the erasures E0 in the codewords are already known from the initial ELP Λ0. The final degree of the auxiliary ELP Λ(x) may become relatively large using the BM algorithm due to a relatively large number of erasures E0, even though the number and locations of the erasures E0 in the codeword are already known. When the number of erasures E0 is high in comparison to the number of errors E1, the result may be complexity and inefficiency that is impractically high for implementation.

SUMMARY

According to an aspect of the present disclosure, a system for hard decision decoding of Reed-Solomon codewords includes an interface and a processing circuit. The interface receives a Reed-Solomon codeword over a channel. The Reed-Solomon codeword includes a plurality of symbols. The processing circuit implements a process for decoding the Reed-Solomon codeword. The processing circuit is configured to: construct a first locator polynomial for the Reed-Solomon codeword to identify locations of erasures in the Reed-Solomon codeword; determine a first syndrome of the Reed-Solomon codeword; calculate a first error evaluator polynomial from the first syndrome and the first locator polynomial; and perform error detection based on the first error evaluator polynomial to determine presence of errors in the Reed-Solomon codeword. When presence of errors in the Reed-Solomon codeword is not detected in the error detection, the processing circuit is configured to bypass updating the first locator polynomial and proceed to completing decoding of the Reed-Solomon codeword. When presence of errors in the Reed-Solomon codeword is detected in the error detection, the processing circuit is configured to update the first locator polynomial to a second locator polynomial before completing decoding of the Reed-Solomon codeword.

According to another aspect of the present disclosure, a method for hard decision decoding of Reed-Solomon codes includes receiving a Reed-Solomon codeword over a channel, the Reed-Solomon codeword comprising a plurality of symbols; constructing a first locator polynomial for the Reed-Solomon codeword to identify locations of erasures in the Reed-Solomon codeword; determining a first syndrome of the Reed-Solomon codeword; calculating a first error evaluator polynomial from the first syndrome and the first locator polynomial; and performing error detection based on the first error evaluator polynomial to determine presence of errors in the Reed-Solomon codeword. When presence of errors in the Reed-Solomon codeword is not detected in the error detection, the method includes bypassing performing a Chien search and proceed to completing decoding of the Reed-Solomon codeword. When presence of errors in the Reed-Solomon codeword is detected in the error detection, the method includes performing the Chien search before completing decoding of the Reed-Solomon codeword.

According to another aspect of the present disclosure, a decoding device for hard decision decoding of Reed-Solomon codes includes an interface and a processing circuit. The interface receives a Reed-Solomon codeword over a channel, the Reed-Solomon codeword comprising a plurality of symbols. The processing circuit implements a process for decoding the Reed-Solomon codeword. The processing circuit is configured to: construct a first locator polynomial for the Reed-Solomon codeword to identify locations of erasures in the Reed-Solomon codeword; determine a first syndrome of the Reed-Solomon codeword; calculate a first error evaluator polynomial from the first syndrome and the first locator polynomial; and perform error detection based on the first error evaluator polynomial to determine presence of errors in the Reed-Solomon codeword. When presence of errors in the Reed-Solomon codeword is not detected in the error detection, the processing circuit is configured to bypass updating the first locator polynomial and proceed to completing decoding of the Reed-Solomon codeword. When presence of errors in the Reed-Solomon codeword is detected in the error detection, the processing circuit is configured to update the first locator polynomial to a second locator polynomial before completing decoding of the Reed-Solomon codeword.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
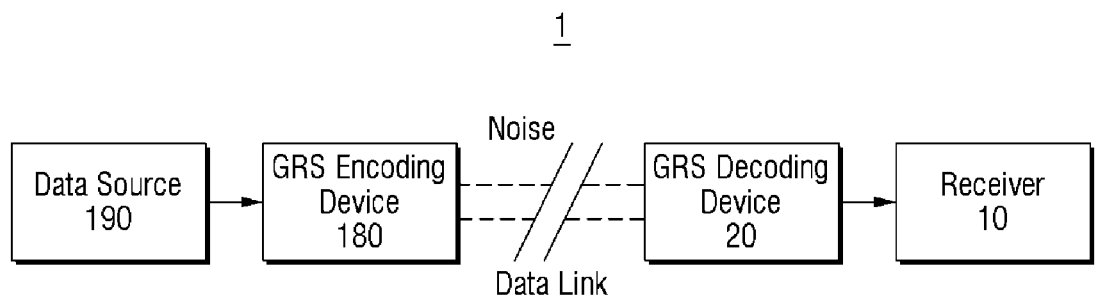
FIG. 1A illustrates a system for efficient hard decision decoding of generalized Reed-Solomon codes in presence of erasures and errors within the Singleton bound, in accordance with a representative embodiment.

In the following detailed description, for the purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only and is not intended to be limiting. As used in the specification and appended claims, the singular forms of terms 'a,' 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims.

As described herein, Reed-Solomon decoding may be performed more efficiently by a variety of mechanisms taught herein. The mechanisms include bypassing complex processing when an early error detection process detects the relative or absolute absence of errors. The mechanisms also include reducing the complexity of even the complex processing when performed, by using a polynomial which reflects the number of errors and not the number of erasures. The mechanisms also include reducing the complexity of even the complex processing when performed, by setting limits to the maximum number of errors which the decoding is configured to correct.

FIG. 1A illustrates a system for efficient hard decision decoding of generalized Reed-Solomon codes in presence of erasures and errors within the Singleton bound, in accordance with a representative embodiment.

The system 1 in FIG. 1A may be a distributed system in which a data source 190 and a GRS encoding device 180 are provided separate from the GRS decoding device 20 and the receiver 10. For example, the GRS encoding device 180 may be used to communicate with the GRS decoding device 20 over a communication network such as a wide area network (WAN) or a local area network (LAN). The communication network by which a data link and noise are provided may be wired and/or wireless.

Alternatively, the system 1 in FIG. 1A may be an integrated system in which the data source 190 and the GRS encoding device 180 are provided together with the GRS decoding device 20 and the receiver 10. For example, the GRS encoding device 180 may be linked directly to the GRS decoding device 20, such as in a host/peripheral relationship in which the GRS encoding device 180 is provided by a host and the GRS decoding device 20 is provided by a peripheral such as a memory controller in a memory system. A direct link between the GRS encoding device 180 and the GRS decoding device 20 may be provided, for example, by one or more wires and/or hardware interfaces. An example of the GRS decoding device 20 provided as a peripheral memory controller in a memory system is shown in and described with respect to FIG. 2. An example context in which the GRS decoding device 20 is provided is for a flash memory, such as in a memory controller for a flash memory system. In the context of a flash memory, the flash memory itself may be or include or included in the receiver 10 and the GRS decoding device 20 may be or include or included in a decoding circuit in a memory controller for the flash memory. A flash memory that uses GRS decoding described herein may be a NAND flash memory, although the GRS decoding is not limited to flash memories let alone NAND flash memories.

Embodiments of the inventive concepts described herein are directed to the GRS decoding device 20 in the context of ECC implemented systems. As described in the Background, a known GRS decoding device typically applies a BM algorithm to the initial ELP Λ0 and the syndrome S(x) with a polynomial of degree of the total number of erasures E0 and errors E1, and the Chien search algorithm to the auxiliary ELP Λ(x) with a polynomial of degree of the total number of erasures E0 and errors E1. The GRS decoding device 20 in FIG. 1 may save unnecessary calculations, by efficiently dealing with erasures and errors. The BM algorithm and Chien search algorithm may be activated conditionally, such as only when the presence of one or more errors E1 is detected in an early stage of the decoding. The complexity of the BM algorithm and Chien search algorithms may also be reduced by using a polynomial of degree of the number of errors E1 only and not the sum of the number of erasures E0 and errors E1 (E0+E1), as the number of errors E1 may be significantly smaller than the total number of erasures E0 in many practical applications. Additional complexity reductions may be achieved by setting a limit to the maximum number of errors E1 to be corrected, by a calculation based on channel statistical characteristics and the required error correction performance of the codeword. These contributions, whether taken individually or in combination, allow for an increase in computation capability of the GRS decoding device 20 and a decrease in circuit complexity of the GRS decoding device 20.

Figure 1B:
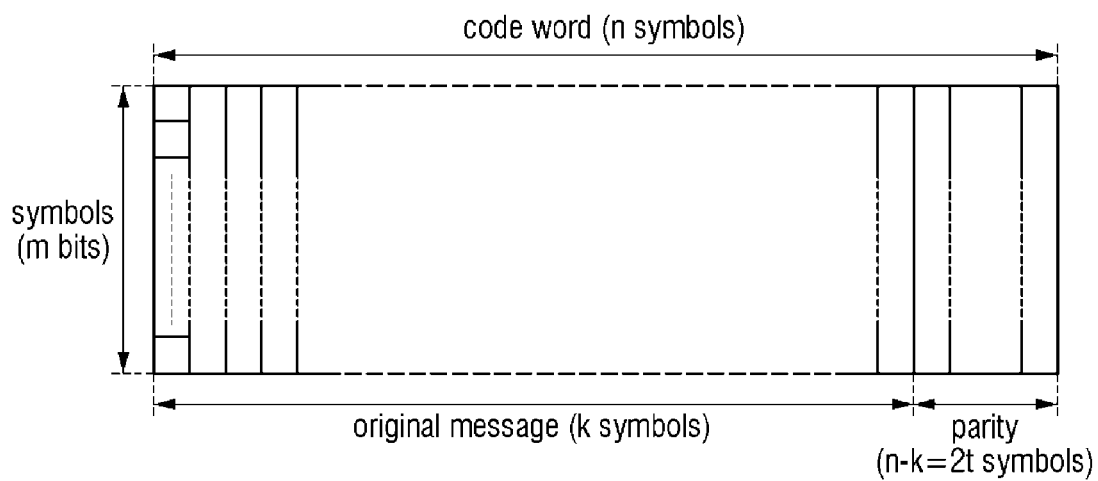
FIG. 1B illustrates an example codeword used in efficient hard decision decoding of generalized Reed-Solomon codes in presence of erasures and errors within the Singleton bound, in accordance with a representative embodiment.

FIG. 1B illustrates an example codeword used in efficient hard decision decoding of generalized Reed-Solomon codes in presence of erasures and errors within the Singleton bound, in accordance with a representative embodiment.

In FIG. 1B, a GRS codeword has n symbols, and each of the n symbols has m bits. The GRS codeword includes symbols of content of the original message encoded by an GRS encoding device 180 along with symbols of parity bits added to the symbols of the content of the original message. The n symbols of the GRS codeword include k symbols of the content of the original message and 2t symbols of the parity bits.

As used herein, the variable "C" or "c" represents a transmitted GRS codeword. The variable "R" or "r" represents a received GRS codeword. The variable "E0" represents erasures as a first form of noise. The variable "E1" represents errors as a second form of noise. The variable "D" represents the minimum distance among all codewords C for which correction of a received codeword R can be ensured. The variable "N" or "n" represents the number of symbols in the codeword C or the length of the codeword C, stated as the number of symbols per codeword. The variable "M" or "m" represents the number of bits per symbol. Given these defined variables, R-C represents the noise codeword and includes both erasures E0 and errors E1.

As additional context for the teachings herein, a check matrix "H" is used to check a received codeword R. The product of multiplying the check matrix H by the received codeword R, i.e., HR, should be zero except when the received codeword R includes noise. When the received codeword R includes noise, the product of multiplying the check matrix H by the received codeword R is HR and by definition HE, since H(C+E) is equal to HC+HE and HC alone is equal to zero. Thus, the product of multiplying the check matrix H by the received codeword R (i.e., the transmitted codeword C plus noise E) equals HE. The codeword noise HE is known as the syndrome S. Syndrome is the remainder after multiplying the check matrix H by the received codeword R, and essentially reflects only the added noise.

In the description that follows, additional variables with different meanings may be referenced. Certain notations and relationships are defined as follows:

{E0},{E1} are the locators of the GRS erasures and errors, respectively.

Λ0(x) is the GRS erasure locator polynomial of the GRS codeword, and may be referred to as the first locator polynomial, the initial locator polynomial, the first erasure locator polynomial, the initial erasure locator polynomial, the first ELP or the initial ELP.

Λ1(x) is the GRS error locator polynomial of the GRS codeword, and may be referred to as the second locator polynomial, the second error locator polynomial, the auxiliary locator polynomial, the second ELP or the auxiliary ELP. In an iterative process described herein, the second ELP Λ1(x) may be generated after (i.e., subsequent to) the first ELP Λ0(x).

$$\lambda(x) = \lambda 0(x) \cdot \lambda 1(x) = \sum\nolimits_{i=0}^{D-1}$$

$\lambda_i$ $x^i$ is the error and erasure locator polynomial of the GRS codeword, and may be referred to as the third locator polynomial, the third error and erasure locator polynomial, or the third ELP . In an iterative process described herein, the third ELP Λ(x) may be generated after (i.e., subsequent to) the second ELP Λ1(x) and after (i.e., subsequent to) the first ELP Λ0(x).

S1(x) is the auxiliary syndrome for simplified BM calculations, and contains part of the coefficients of Λ0(x)S(x).

E(1,max) is the maximum expected number of erroneous symbols in the GRS codeword.

As the maximum correctable number of errors is $\lfloor(D-1)/2\rfloor$, the relationship: $E(1,max) \leq \lfloor(D-1)/2\rfloor$ holds.

E (0,min) is the minimal expected number of erasures.

If no assumptions can be made on E0, the worst case is that E(0,min)=0 and D-1 symbols will be used for S1(x).

If some assumptions can be made (E(0,min)>0), less memory can be allocated to S1(x).

Figure 2:
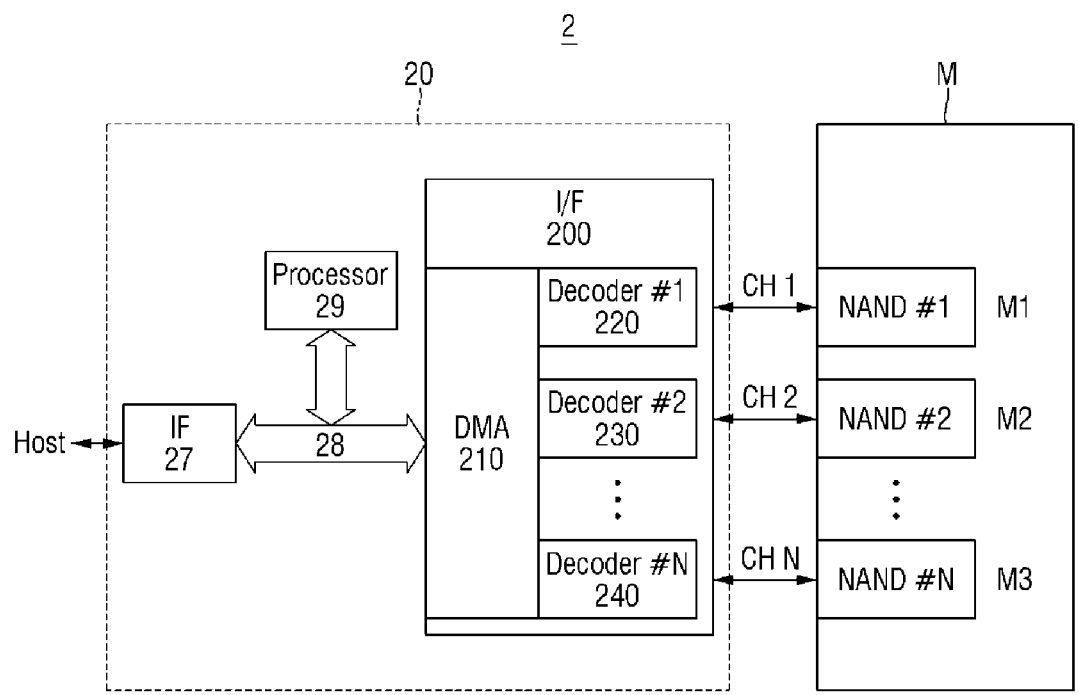
FIG. 2 illustrates another system for efficient hard decision decoding of generalized Reed-Solomon codes in presence of erasures and errors within the Singleton bound, in accordance with a representative embodiment.

FIG. 2 illustrates another system for efficient hard decision decoding of generalized Reed-Solomon codes in presence of erasures and errors within the Singleton bound, in accordance with a representative embodiment.

The system in FIG. 2 is a block diagram of a memory system 2 such as a flash memory system. The memory system 2 includes a GRS decoding device 20 and a memory block M. The GRS decoding device 20 may be, included in, or may include, for example, a memory controller. In the example of FIG. 2, the GRS decoding device 20 includes a multi-channel error correction coder (ECC) architecture for encoding/decoding data between a host system and the memory block M. The GRS decoding device 20 includes a host interface 27, a NAND interface 200, and a processor 29, all connected together by a system bus 28. The NAND interface 200 includes a DMA controller 210 (direct memory access controller) and a block of error correction coder (ECC) circuits. The block of error correction coder circuits includes a plurality (N) of ECC modules, including a first decoder 220 as decoder #1, a second decoder 230 as decoder #2, and a third decoder 240 as decoder #3. Memory block M includes a plurality (N) of NAND memory devices, including a first NAND memory M1 as memory #1, a second NAND memory M2 as memory #2, and a third NAND memory M3 as memory #3. Connected between each of the ECC modules and a corresponding one of the first NAND memory M1, the second NAND memory M2 and the third NAND memory M3 are channels CH1, CH 2 through CH 3, respectively. Of course, the number of ECC modules, the number of NAND memories and the number of channels is not limited to 3, and may instead be more or less than 3. Additionally, the ECC modules and the NAND memories are shown in FIG. 2 in a 1-1 relationship; however, an ECC module may be dedicated to more than one NAND memory without departing from the spirit of the teachings herein. Moreover, the teachings herein are not limited to NAND flash memory arrangements, or even only to flash memories. Rather, the teachings herein are applicable to GRS implementations in any of a variety of contexts.

Each of the first decoder 220, the second decoder 230 and the third decoder 240 in the multi-channel error correction coding architecture of the GRS decoding device 20 in FIG. 2 may separately include an encoder and decoder, and the decoder may include subcircuits such as an error detector and an error corrector.

In operation, data from a host device such as a computer may be destined to be stored in the memory block M. For example, data may be sent by the DMA controller 210 to the first decoder 220. In the first decoder 220, the data is first encoded by an encoder and then transmitted to the memory block M via channel 1. When data is to be read from memory block M and provided to the host device, the data is first decoded by the first decoder 220 and then the decoded data is supplied to DMA controller 210. In the first decoder 220, a detector detects whether any errors are present in the data received from the memory block M, and if there are any errors, then a corrector corrects the errors.

Each of the first decoder 220, the second decoder 230 and the third decoder may each be configured to operate according to the teachings herein, and each may separately include the same or similar processing circuits. A processing circuit described herein may be or include a circuit as simple as a memory that stores instructions and a processor that executes the instructions, or a more complex circuit such as an application-specific integrated circuit (ASIC) with more than two circuit elements which may still include one or more memory/processor combinations. Examples of processors which may be used by a processing circuit include microprocessors. Each of these decoders may bypass complex processing when an early error detection process detects the relative or absolute absence of errors. Each of these decoders may operate with polynomials which reflects the number of errors in received GRS codewords R and not the number of erasures in the received GRS codewords R. Each of the codewords may also set limits to the maximum number of errors E1 which the respective decoder is configured to correct. The decoders in FIG. 2 may include the processing circuit of FIG. 3, and may operate according to the methods described in FIG. 4 or FIG. 5.

Figure 3:
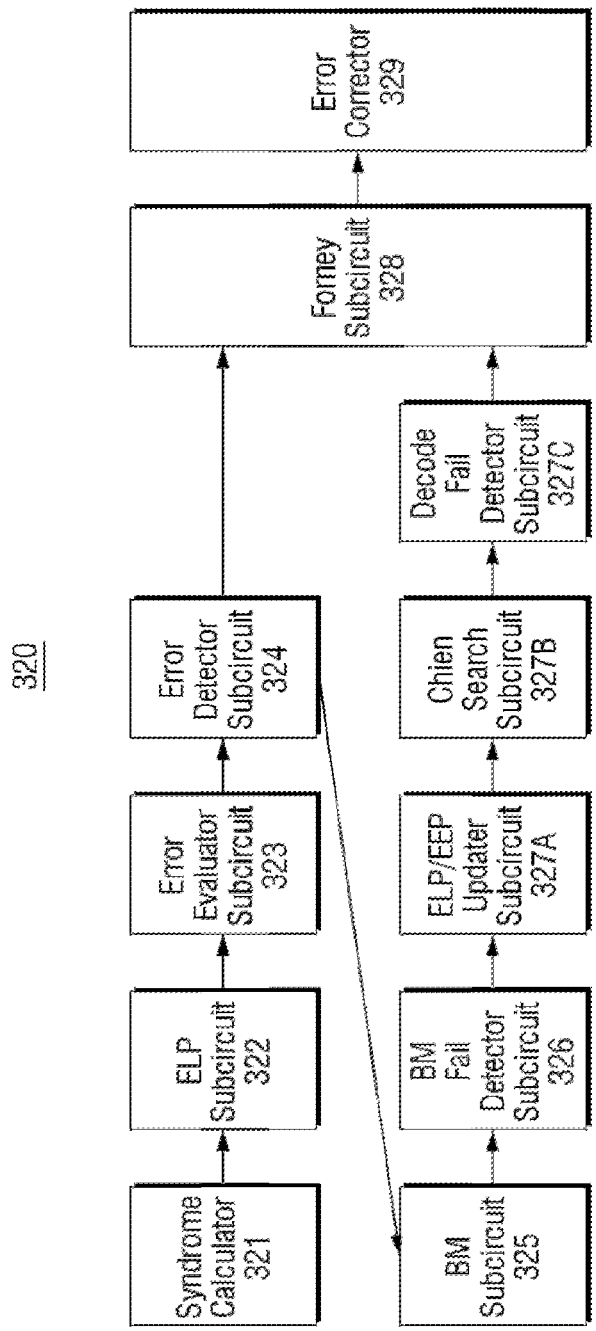
FIG. 3 illustrates a processing circuit for efficient hard decision decoding of generalized Reed-Solomon codes in presence of erasures and errors within the Singleton bound, in accordance with a representative embodiment.

FIG. 3 illustrates a processing circuit for efficient hard decision decoding of generalized Reed-Solomon codes in presence of erasures and errors within the Singleton bound, in accordance with a representative embodiment.

The processing circuit 320 in FIG. 3 may correspond to some or all of the elements of any of the ECC modules in FIG. 2, including the first decoder 220, the second decoder 230 or the third decoder 240. Decoders described herein are configured to decode Reed-Solomon codes in presence of erasures E0 and errors E1. The decoders are typically implemented by a processing circuit such as the processing circuit 320.

The processing circuit 320 includes a syndrome calculator 321, an ELP subcircuit 322, an error evaluator subcircuit 323, an error detector subcircuit 324, a BM subcircuit 325, a BM fail detector subcircuit 326, an ELP/EEP updater subcircuit 327A, a Chien search subcircuit 327B, a decode fail detector subcircuit 327C, a Forney subcircuit 328, and an error corrector 329. Before proceeding, it should be clear that figures herein, including FIG. 1A, FIG. 2 and FIG. 3 show and reference elements that are or include circuitry with labels such as "source" "device", "receiver", "decoder", "calculator", "subcircuit" or similar terms analogous to "circuit" or "block". As is traditional in the field of the inventive concept(s) described herein, examples may be described and illustrated in terms of such labelled elements which carry out a described function or functions. These labelled elements, or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting such labelled elements may be implemented by dedicated hardware, or by a processor (e.g., one or more programmed microprocessors and associated circuitry), or by a combination of dedicated hardware to perform some functions of the labelled element and a processor to perform other functions of the labelled element. Each labelled element of the examples may be physically separated into two or more interacting and discrete circuits without departing from the scope of the present disclosure.

The syndrome calculator 321 calculates the syndrome S(x). As a reminder, the syndrome S(x) contains information of numbers of and locations of errors E1 in a received codeword R. The syndrome S(x) may be considered a first syndrome.

The ELP subcircuit 322 constructs the initial erasure locator polynomial (ELP) Λ0. As a reminder, the initial ELP Λ0 contains information of locations of E0 erasures in a received codeword R. The initial ELP Λ0 may be considered a first ELP.

The error evaluator subcircuit 323 is a new type of circuit or subcircuit that implements several characteristic functions. Initially, the error detector subcircuit 324 operates to detect whether errors E1 exist in the received codeword R, since if no or minimal errors E1 exist in the received codeword R, application of the BM algorithm by the BM subcircuit 325 and the Chien search by the Chien search subcircuit 327B may be bypassed. Other types of processing by subcircuits shown in FIG. 3 may also be bypassed if no or minimal errors E1 are detected.

In order to detect whether errors E1 exist in the received codeword R, the ELP subcircuit 322 calculates an initial erasure evaluator polynomial (initial EEP) Γ0(x). The initial EEP Γ0(x) is calculated before the BM algorithm is applied by the BM subcircuit 325 or the Chien search is performed by the Chien search subcircuit 327B. Additionally, the initial EEP Γ0(x) is calculated based on the initial ELP Λ0 and the syndrome S(x), and reflects the known number and locations of erasures E0. However, the numbers and locations of errors E1 are derivable from the syndrome S(x) but not yet known after the initial EEP Γ0(x) is calculated by the ELP subcircuit 322.

The error evaluator subcircuit 323 output is used by error detector subcircuit 324 to detect errors based on the initial EEP Γ0(x). Coefficients of the initial EEP Γ0(x) are used to detect existence of error symbols. If a detectable error exists, at least one the coefficients with indices E0 to D-2 of the polynomial must be nonzero.

The error evaluator subcircuit 323 also calculates an auxiliary syndrome S1(x) as a function of the initial EEP Γ0(x). The auxiliary syndrome S1(x) may be considered a second syndrome. The auxiliary syndrome S1(x) may be used by the BM subcircuit 325 for the BM algorithm to simplify the BM processing by applying the BM algorithm only to the errors E1 and not to the erasures E0. The auxiliary syndrome S1(x) may also be used by the Chien search subcircuit 327B for the Chien search by eliminating the erasures E0 from the Chien search.

The error detector subcircuit 324 detects whether errors were detected in the error detection by the error evaluator subcircuit 323. If no errors are detected, or if the number of detected errors is otherwise below a threshold, the actual EEP Γ(x) will be the initial EEP Γ0(x), the auxiliary ELP Λ(x) will be the initial ELP Λ0, and processing by the processing circuit 320 will proceed directly to the Forney subcircuit 328. Otherwise, if errors are detected, or if the number of detected errors is at or above a threshold, processing is next performed by the BM subcircuit 325.

The BM subcircuit 325 constructs an auxiliary ELP (second ELP) by applying the BM algorithm. The auxiliary ELP may be considered a second ELP. The auxiliary ELP Λ1 is calculated by the BM subcircuit 325 as a function of only the auxiliary syndrome S1(x) calculated by the error evaluator subcircuit 323, and not as a function of the syndrome S(x). The auxiliary ELP Λ1 reflects only the number of errors E1 and not the number of erasures E0. The auxiliary ELP Λ1 calculated by the BM subcircuit 325 may be considered an error locator polynomial as compared to the initial ELP Λ0 (erasure locator polynomial) calculated by the ELP subcircuit 322.

The output of the BM subcircuit 325 includes the second ELP Λ1(x). The second ELP Λ1(x) is the minimal polynomial with zeros related to the locations of the errors E1 in the received GRS codeword R. The output of the BM subcircuit 325 also includes an integer L1 which is equal to the maximal power of the second ELP Λ1. The inputs to the BM subcircuit 325 include D, S1(x) and E0. As a reminder, D is the minimum distance of the GRS codeword, and S1(x) is the auxiliary syndrome polynomial and contains the necessary coefficients of Γ0(x).

At the initialization stage, the BM subcircuit 325 sets the second ELP Λ1(x) to 1 and L1 to 0 before performing iterations from E0+1 to D-1. However, the number of multiplications in the discrepancy calculation per iteration is equal to L1 rather than L0+L1 since only the errors E1 are considered. Additionally, the worst case degree for the second ELP Λ1 is the maximum degree of E1-1, rather than the D-2 worst case (i.e., reflecting both E0 and E1) as when conventionally applying the BM algorithm.

The BM fail detector subcircuit 326 determines whether the BM algorithm has failed. The BM algorithm is likely to fail when the number of errors E1 added to the number of erasures E0 will mean the codeword C is outside of the Singleton bound.

Figure 4:
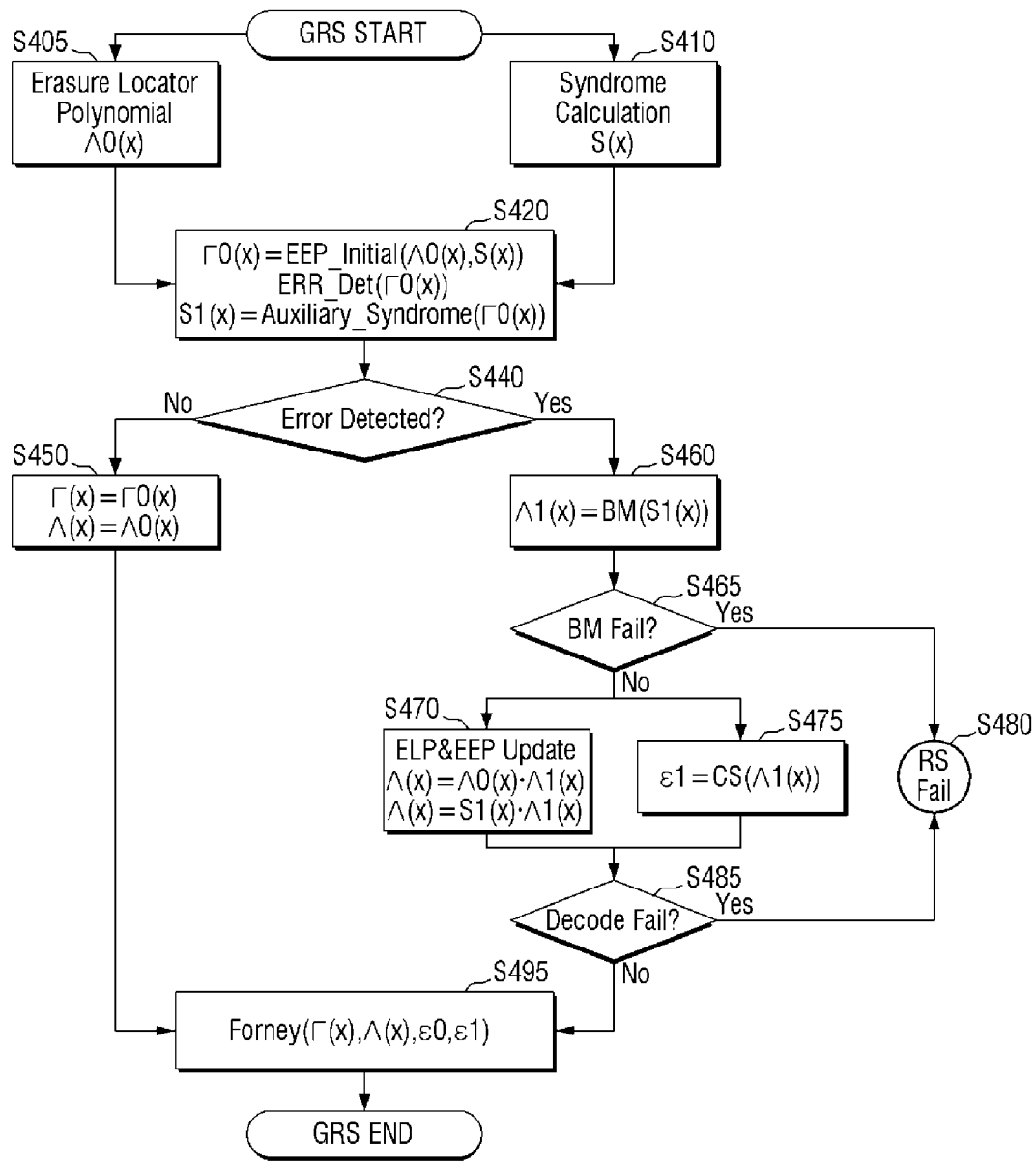
FIG. 4 illustrates a method for efficient hard decision decoding of generalized Reed-Solomon codes in presence of erasures and errors within the Singleton bound, in accordance with a representative embodiment.

The ELP/EEP updater subcircuit 327A calculates the final ELP as a function of both the initial ELP Λ0 and the second ELP Λ1. In FIG. 3 and FIG. 4, the final ELP calculated by the ELP/EEP updater subcircuit 327A may be considered a third ELP, and reflects the first ELP Λ0 for the erasures E0 and the second ELP Λ1 for the errors E1. The final ELP Λ(x) is used subsequently as an input by the Forney subcircuit. The ELP/EEP updater subcircuit 327A also calculates the actual EEP Γ(x) as a function of the auxiliary syndrome S1(x) and the second ELP Λ1. The actual EEP Γ(x) is used subsequently as an input by the Forney subcircuit. The actual EEP Γ(x) may be considered a second EEP in the context of the teachings herein.

The Chien search subcircuit 327B identifies the locations of errors E1 based on the second ELP Λ1 by performing a Chien search reflective of the errors E1 and not the erasures E0. The Chien search may also be performed conditioned on or limited to the number of tolerable errors E1 before the Singleton bound will not be met. For example, the Chien search may not be performed if the number of errors E1 will result in the codeword not meeting the Singleton bound. Although the Chien search subcircuit 327B is shown receiving the output of the ELP/EEP updater subcircuit 327A, the Chien search also works on an input of the second ELP Λ1. As such, the Chien search subcircuit 327B may be arranged to work in parallel with the ELP/EEP updater subcircuit 327A.

The math processing in the Chien search by the Chien search subcircuit 327B is performed only on the second ELP Λ1(x), which is the part of the ELP that contains only the locations of the errors E1, and which by definition has a lower power than Λ(x), as the power of Λ(x) is E0+E1 and the power of Λ1(x) is only E1. In many useful cases E0 is much bigger than E1, such as if a codeword R length is 74 and includes 72 erasures E0 so the potential for errors E1 is only 2 Since the power of a polynomial reflects the number of erasures E0 in the case of the first ELP $\Lambda 0(x)$ and the errors E1 in the case of the second ELP $\Lambda 1(x)$, operating based on the number of errors E1 may result in much less processing and much smaller hardware requirements.

Additionally, the second ELP $\Lambda 1(x)$ has a power that is the number of errors E1, so a limit may be imposed on processing based on the number of errors. For example, if statistical knowledge about a channel is known with a satisfactory level of confidence, the number of expected errors E1 may be used to support a lower maximum number of errors E1 than the worst case. The Chien search described herein will avoid exhaustive searching for a polynomial which is of a very high power, for example, 70, and instead is limited to a search on a very low power polynomial for example, two or three. This translates in lower hardware requirements for an application-specific integrated circuit (ASIC) used to implement the Chien search subcircuit 327B. Additionally, if a limit is set on the maximum power of the second ELP $\Lambda 1(x)$, hardware requirements may can be lowered to a relatively small amount compared to enabling processing for the worst case of the second ELP $\Lambda 1(x)$ power or $\Lambda(x)$ power from the traditional decoding process.

The decode fail detector subcircuit 327C is likely to detect decode fail when the number of erasures E0 and the number of errors E1 results in the codeword being outside of the Singleton bound such that the decoding fails.

The Forney subcircuit 328 performs conventional Forney processing based on the final ELP $\Lambda(x)$ and the actual EEP $\Gamma(x)$ along with the number of erasures E0 and the number of errors E1. The error corrector 329 corrects each identified erasure and error based on the Forney processing.

Using the processing circuit 320, application of the BM algorithm and a Chien search may both be bypassed if errors are not detected by the error detector subcircuit 324. However, even if errors are detected by the error detector subcircuit 324, calculation of the auxiliary syndrome S1 and the initial EEP $\Gamma(x)$ results in greatly simplified processing by the BM subcircuit 325 and the Chien search subcircuit 327B. Additionally, the BM fail detector subcircuit 326 may be configured in such a manner, that if a BM fail was detected (which may happen when the Singleton bound will not be met), then the Chien search by the Chien search subcircuit 327B and subsequent processing is not performed. Processing in the processing circuit 320 of FIG. 3 is assumed to be performed on a full set of frames in order for a GRS codeword. The hardware blocks of the processing circuit 320 are arranged in order so as to process full sets of frames in order for each GRS codeword.

FIG. 4 illustrates a method for efficient hard decision decoding of generalized Reed-Solomon codes in presence of erasures and errors within the Singleton bound, in accordance with a representative embodiment.

As described below with respect to FIG. 4, generalized GRS decoding may be performed efficiently by bypassing processing-intensive steps when appropriate based on detecting the absence of errors early. Bypassing steps may mean that functionality is not performed when the functionality would otherwise be performed, based on a dynamic determination. Additionally, the processing-intensive steps may be performed more efficiently by eliminating consideration of erasures E0 when appropriate, and eliminating the Chien search based on determining in advance that the number of errors E1 will result in a codeword being outside the Singleton bound. For the purposes of FIG. 4, E(1,max) may be considered the maximum expected number of erroneous symbols in a GRS codeword based a statistical model for the channel. As the maximum correctable number of errors is $\lfloor (D-1)/2 \rfloor$, the relationship $E(1,max) \leq \lfloor (D-1)/2 \rfloor$ holds. To save on the implementation complexity, application of a BM algorithm at S460 and a Chien search at S475 may be limited to E(1,max) instead of the much-longer D-1, to reduce the area and power consumption of these blocks (if implemented in hardware). The simplification may occur primarily in the application of the BM algorithm at S460 and the Chien search stage at S475, primarily due to the reduction in the maximum ELP degree and the skipping of unnecessary activations of these stages.

The method of FIG. 4 is for Reed-Solomon (RS) decoding, and starts with the GRS Start label and ends with the GRS End label. At the start, a first erasure locator polynomial ELP0 $\Lambda 0(x)$ is generated at S405 and the first GRS syndrome S(x) is calculated at S410. The generation of the first erasure locator polynomial ELP0 $\Lambda 0(x)$ at S405 and the calculation of S(x) at S410 may be simultaneous, may overlap, or may be sequential so that one occurs before the other.

At S420, a first (initial) error evaluator polynomial $\Gamma 0(x)$ is calculated from the first GRS syndrome S(x) and the first erasure locator polynomial ELP0 $\Lambda 0(x)$. At S420, the presence of any errors E1 in the codeword is also detected based on the first (initial) error evaluator polynomial $\Gamma 0(x)$. At S420, a second (auxiliary) syndrome S1(x) is also calculated based on the first erasure locator polynomial ELP0 $\Lambda 0(x)$.

At S440, error detection is performed based on the first error evaluator polynomial to determine presence of errors in the Reed-Solomon codeword. The error detection at S440 is a determination of whether the error detection at S420 based on the calculation of the first (initial) error evaluator polynomial $\Gamma 0(x)$ has identified the presence of any errors, or a number of errors at or above a threshold.

If no errors are detected, or the number of errors is not at or above a threshold, in the error detection (S440=No), updating of the first erasure locator polynomial ELP0 $\Lambda 0(x)$ is bypassed, and the method of FIG. 4 proceeds to completing decoding of the Reed-Solomon codeword. Also, when no errors are detected, or the number of errors is not at or above a threshold, in the error detection (S440=No), a Chien search is bypassed, and the method of FIG. 4 proceeds to completing decoding of the Reed-Solomon codeword. In other words, complex processing from S460, S465, S470, S475, S480, and S485 may be bypassed, omitted, or otherwise not performed based on the absence of errors detected at S440. When errors are detected at S440, the processing which may otherwise be bypassed is instead performed.

The error detection at S440 may involve a threshold, such as zero errors, no more than one error, no more than two errors, no more than five errors, or another number of tolerable errors. Since many, most, or perhaps almost all Reed-Solomon codewords may contain zero or very few errors E1, performing the error detection at S440 may provide for substantial reductions in hardware, power use, processing requirements and more. When the context of the Reed-Solomon decoding in FIG. 4 involves widespread and pervasive errors E1, the error detection at S440 may not result in such substantial reductions, though even in this case processing such as a Chien search may be cancelled when the number of errors E1 will place the codeword outside of the Singleton bound.

If errors are detected in the error detection (S440=Yes), at S460 the BM algorithm is applied. The BM algorithm applied at S440 to S1(x) rather than S(x) and the first erasure locator polynomial ELP0 $\Lambda 0(x)$. The auxiliary syndrome S1(x) is the auxiliary syndrome polynomial and contains the necessary coefficients of Γ0(x).

The BM algorithm provides two outputs, including the second locator polynomial ELP1 Λ1(x) and an integer L1. The second locator polynomial ELP1 Λ1(x) is the minimal polynomial with zeros which are related to the locations of the GRS errors (if E0+E1≤D). The integer L1 is equal to the maximal power of the second locator polynomial ELP1 Λ1(x). The BM algorithm initializes and then iterates to identify errors E1. An example iterative process for the BM algorithm at S460 is as follows:

for j=E0+1 to D-1, set d=coef(X^(j-1)) (Λ1(x) S1(x)) // Δj
  if d=0, then // Λ1 unchanged, and update δ←δ+1
  if d≠0 and j-E0≤2L1, then // Λ1 changes without length change,
    update Λ1(x)←Λ1(x)-db^(-1) ^δX ΛAP(x), and update δ←δ+1
  if d≠0 and j-E0≥2L1+1, then // length change, set TMP=Λ1(x),
    update Λ1(x)←Λ1(x)-db^(-1) X^δ ΛAP(x), update L1←j-
    L1-E0, set ΛAP(x)=TMP, set b=d, and set δ=1
  If L1≥⌊(D-1-E0)/2⌋+1, then set BM_error=1

The above iterative process creates a second locator polynomial ELP1 Λ1(x) of a minimal degree, whose zeros are related to the error locations, the information on which is contained in the auxiliary syndrome polynomial S1(X). The process begins with creating a polynomial which satisfies the condition on the first S1(X) coefficient and then continues in an attempt to satisfy the conditions on all S1(X) coefficients.

At S465, a determination is made as to whether the BM algorithm at S460 has failed. The BM algorithm may fail, for example, if the number of identified errors El would place the codeword outside of the Singleton bound.

If the BM algorithm at S460 has failed (S465=Yes), at S480 the Reed-Solomon decoding is deemed to fail and the process ends.

If the BM algorithm at S460 has not failed (S465=No), at S470 the ELP and the EEP are updated. The ELP is updated to the third ELP Λ(x) by multiplying the first ELP Λ0 and the second ELP Λ1. The EEP is updated by calculating Γ(x) as a function of the auxiliary syndrome S1(x) and the second ELP A1. In parallel with S470, at S475 the Chien search is performed to identify locations of each error E1.

At S485, a determination is made as to whether decoding has failed, such as based on whether too many errors are still present in the Reed-Solomon codeword for which the processes of S460, S465, S470 and S475 were performed.

At S495, Forney processing is performed. Forney processing is performed when no errors are detected at S440, and when S460, S465, S470 and S475 have been deemed to be successful at S485.

Using the method of FIG. 4, error detection is performed at S420 and S440 prior to BM activation at S460 to reduce average latency. The BM algorithm is executed and the Chien search is performed efficiently, when performed at all, by using the second ELP Λ1 of power E1, instead of using the third ELP Λ(x) with power E0+E1 in BM and Chien search stages. Additionally, the second ELP Λ1(x) maximum power may be limited to a value E(1,max)<D/2, to eliminate unnecessary processing that will nevertheless fail to meet the Singleton bound.

The method of FIG. 4 is based on a variety of modifications and updates to conventional GRS decoding. For example, the syndrome used in the BM algorithm is an updated syndrome denoted by S1(x). Several BM parameters are to be updated and the BM output of the second ELP Λ1(x) may have a lower degree than the first ELP Λ0(x) that contains the locations of the erasures E0, as this allows to simplify the Chien search. A simplified EEP calculation is made, updating the second ELP Λ1(x) only.

In embodiments based on a modification to FIG. 3 and FIG. 4, Forney erasures and error estimation may be performed using the existing Forney method with the third ELP Λ(x) or by a simplified Forney block that does not require an ELP update to obtain the auxiliary ELP Λ(x). As a reminder, the third ELP Λ(x) according to the teachings herein may correspond to the auxiliary ELP Λ(x) in known teachings.

The method of FIG. 4 includes a check fail condition at S485. If $E_0 \geq D_k$, the number of erasures E0 is above the GRS correction capability (Singleton bound), such that the Reed-Solomon decoding is deemed to fail. In other words, when $E_0 \geq D_k$, the decoding is deemed to fail at S485 and is terminated. This determination may be performed with or immediately after S440 as another mechanism to bypass complex processing when such processing cannot result in successful GRS decoding.

If an error is detected at S420 and S440, an auxiliary syndrome S1(x) may be used for the BM algorithm, which enables simplification of the BM processing and the Chien search, which will be performed on the errors E1 only.

Error case decoding in FIG. 4 is provided as follows. If errors are detected, then the auxiliary syndrome S 1(x) is used for the BM error locator polynomial calculation.

The Chien search in FIG. 4 is performed to find error locators from all possible inputs, i.e., for i=1:N . If Λ1($\alpha_i^{-1}$)=0, the Chien search involves checking if $\alpha_i^{-1}$ to find a root of Λ1(X) {$e_1$}=[{$e_1$},i] involves adding i to the list of errors. CS_fail=({$e_1$}≠E1) indicates that the Chien search succeeds only if E1 roots were found. If the Chien search fails, the decoding is terminated since the Reed-Solomon decoding has failed. Λ(X)=Λ0(X)·Λ1(X) involves updating the ELP to account for erasures E0 and errors E1. Γ(x) is calculated based on adding errors to the initial EEP Γ0. If no errors are identified, then Λ(X)=Λ0(X) and Γ(X)=Γ0(X) as shown in S450.

Figure 5:
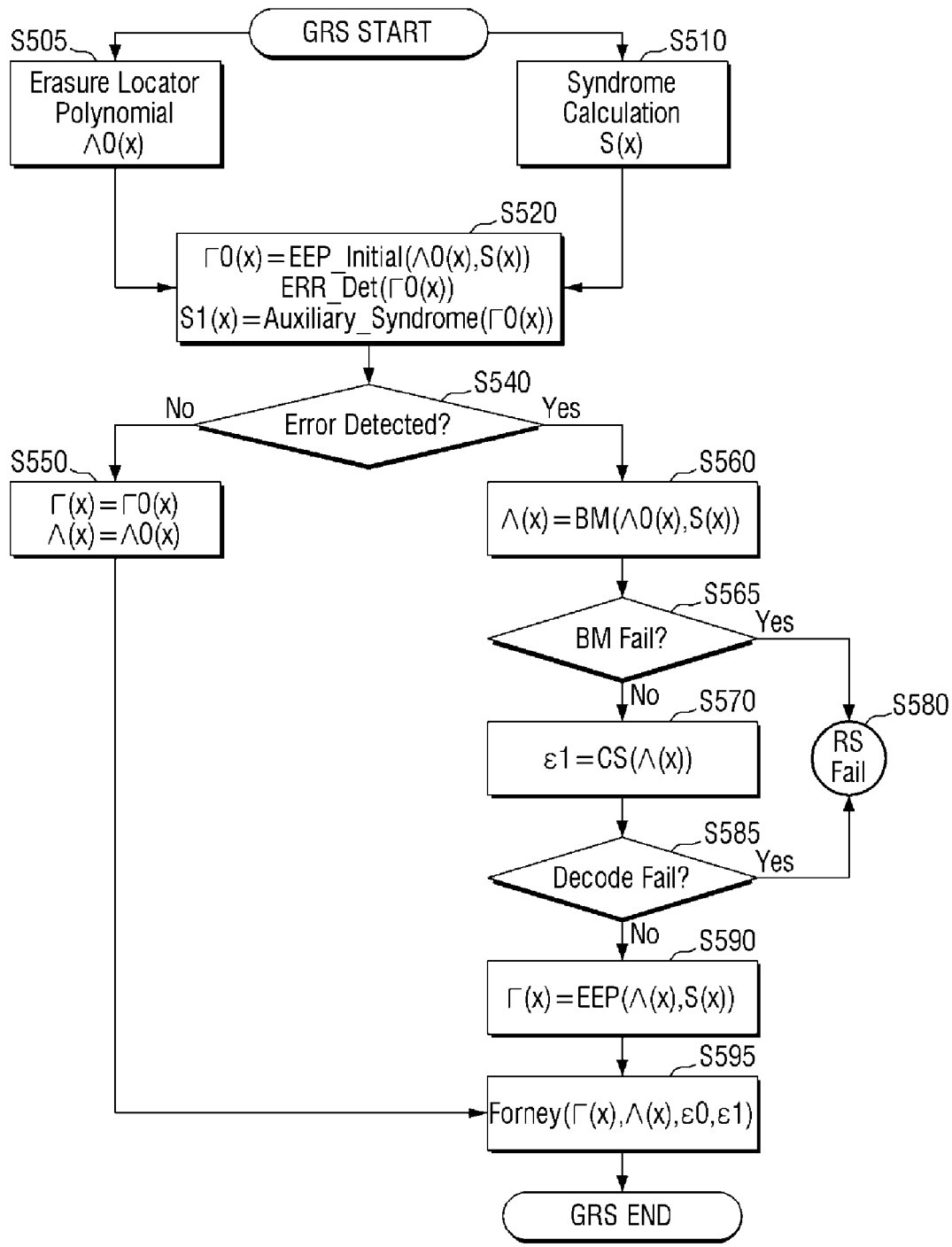
FIG. 5 illustrates another method for efficient hard decision decoding of generalized Reed-Solomon codes in presence of erasures and errors within the Singleton bound, in accordance with a representative embodiment.

FIG. 5 illustrates another method for efficient hard decision decoding of generalized Reed-Solomon codes in presence of erasures and errors within the Singleton bound, in accordance with a representative embodiment.

Relative to the embodiment of FIG. 4, the process when errors are detected at S540 is closer or even identical to a conventional process for processing Reed-Solomon codewords. The method of FIG. 5 is for Reed-Solomon (RS) coding, and again starts with the GRS Start label and ends with the GRS End label. At the start, an erasure locator polynomial Λ0(x) is generated at S505 and the GRS Syndrome is calculated at S510. The generation of the erasure locator polynomial Λ0(x) at S505 and the calculation of the GRS Syndrome at S510 may be simultaneous, may overlap, or may be sequential so that one occurs before the other.

At S520, a first (initial) error evaluator polynomial is calculated from the first syndrome and the first erasure locator polynomial Λ0(x).

At S540, error detection is performed based on the first error evaluator polynomial to determine presence of errors in the Reed-Solomon codeword.

If no errors are detected in the error detection (S540=No), the processes of S560, S565, S570, S580, S585 and S590 are not performed, whereas if errors are detected (S540=Yes), the processes of S560, S565, S570, S575, S580, S585 and S590 are performed. In other words, complex processing from S560, S565, S570, S580, and S585 and S590 may be bypassed, omitted, or otherwise not performed based on the absence of errors detected at S540. When errors are detected at S540, the processing which may otherwise be bypassed is instead performed.

The error detection at S540 may again involve a threshold, such as zero errors, no more than one error, no more than two errors, no more than five errors, or another number of tolerable errors. Since many, most, or perhaps almost all Reed-Solomon codewords may contain zero or very few errors, performing the error detection at S540 may provide for substantial reductions in hardware, power use, processing requirements and more. When the context of the Reed-Solomon decoding in FIG. 5 involves widespread and pervasive errors, the error detection at S540 may not result in such substantial reductions.

The processes of S560, S565, S570, S580, S585 and S590 mimic a standard decoding method for GRS decoding in the presence of erasures and errors.

In FIG. 4, the third ELP $\Lambda(x)$ is calculated at S560 by the BM algorithm. The BM algorithm fails when the degree of the third ELP $\Lambda(x)$ is too high as determined at S565. The GRS decoding is deemed to fail if the number of erasures E0 and errors E1 after the Chien search would place the codeword outside of the Singleton bound. In FIG. 5, the Chien Search is performed to find error E1 and erasure E0 locations from all possible inputs, as compared to FIG. 4 where only the error E1 locations are found in the Chien search. The algorithm in the standard method also includes the Forney estimation of erasures and errors.

As set forth above, GRS decoding may be implemented with low complexity when the Singleton bound $(2t+s \leq d-1)$ holds. A decoding algorithm may include verification components that inform the GRS decoding device 120 when decoding fails. Such failure occurs when the assumption that the Singleton bound $(2t+s \leq d-1)$ holds was incorrect.

Example Case

In an example, for a GRS codeword with N=74, D=73 and the number of erasures is likely to be: $E_0=71$ or $E_0=69$:

| Case | N | $E_0$ | N − $E_0$ |
|---|---|---|---|
| 1 | 74 | 71 | 3 |
| 2 | 74 | 69 | 5 |

The potential gain is a dramatic reduction in the ELP max degree as can be seen in the table below:

| Case | ELP Max Degree |
|---|---|
| 1 - no simplification | 72 |
| 1 - simplified | 1 |
| 2 - no simplification | 71 |
| 2 - simplified | 2 |

The impact of modifications for the BM subcircuit 325 and application of the BM algorithm at S460 may include use of fewer Syndrome coefficients, lower memory and processing requirements, lower hardware requirements and more.

Accordingly, efficient hard decision decoding of generalized Reed-Solomon codes in presence of erasures and errors within the Singleton bound enables GRS decoding that handles errors with complexity that is independent of numbers of erasures.

Although efficient hard decision decoding of generalized Reed-Solomon codes in presence of erasures and errors within the Singleton bound has been described with reference to several exemplary embodiments, it is understood that the words that have been used are words of description and illustration, rather than words of limitation. Changes may be made within the purview of the appended claims, as presently stated and as amended, without departing from the scope and spirit of efficient hard decision decoding of generalized Reed-Solomon codes in presence of erasures and errors within the Singleton bound in its aspects. Although efficient hard decision decoding of generalized Reed-Solomon codes in presence of erasures and errors within the Singleton bound has been described with reference to particular means, materials and embodiments, efficient hard decision decoding of generalized Reed-Solomon codes in presence of erasures and errors within the Singleton bound is not intended to be limited to the particulars disclosed; rather efficient hard decision decoding of generalized Reed-Solomon codes in presence of erasures and errors within the Singleton bound extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

We claim:

1. A system for hard decision decoding of Reed-Solomon codewords, the system comprising:
an interface that receives a Reed-Solomon codeword over a channel, the Reed-Solomon codeword comprising a plurality of symbols;
a processing circuit comprising at least one decoder that implements a process for decoding the Reed-Solomon codeword, wherein the processing circuit is configured to:
construct a first locator polynomial for the Reed-Solomon codeword to identify locations of erasures in the Reed-Solomon codeword;
determine a first syndrome of the Reed-Solomon codeword;
calculate a first error evaluator polynomial from the first syndrome and the first locator polynomial;
perform error detection based on the first error evaluator polynomial to detect a presence of errors in the Reed-Solomon codeword; and
when the presence of errors in the Reed-Solomon codeword is not detected in the error detection, bypassing, by the at least one decoder, updating the first locator polynomial and proceed to completing decoding of the Reed-Solomon codeword, or
when the presence of errors in the Reed-Solomon codeword is detected in the error detection, updating, by the at least one decoder, the first locator polynomial to a second locator polynomial before completing decoding of the Reed-Solomon codeword.

2. The system of claim 1, wherein the processing circuit is further configured to:
determine a second syndrome of the Reed-Solomon codeword based on the first error evaluator polynomial,
wherein the first locator polynomial is updated to the second locator polynomial using a Berlekamp-Massey (BM) algorithm and based on the second syndrome.

3. The system of claim 1,
when the presence of errors in the Reed-Solomon codeword is not detected in the error detection, bypass performing a Chien search and proceed to completing decoding of the Reed-Solomon codeword; and
when the presence of errors in the Reed-Solomon codeword is detected in the error detection, perform the Chien search before completing decoding of the Reed-Solomon codeword.

4. The system of claim 3, wherein the Chien search is performed with the second locator polynomial, and wherein the second locator polynomial has a power lower than the first locator polynomial in at least one instance.

5. The system of claim 4, wherein the processing circuit is further configured to:

calculate a first error evaluator polynomial based on the first locator polynomial and the first syndrome before performing the error detection; and
perform the error detection based on the first error evaluator polynomial.

6. The system of claim 5, wherein the processing circuit is further configured to:
when the presence of errors in the Reed-Solomon codeword is detected in the error detection, calculate a second error evaluator polynomial, wherein the second error evaluator polynomial has a power higher than the first error evaluator polynomial;
when the presence of errors in the Reed-Solomon codeword is detected in the error detection, calculate a third locator polynomial; and
when the presence of errors in the Reed-Solomon codeword is detected in the error detection, complete decoding of the Reed-Solomon codeword using the second error evaluator polynomial and the third locator polynomial.

7. The system of claim 6, wherein the processing circuit is further configured to:
determine a second syndrome of the Reed-Solomon codeword based on the first error evaluator polynomial.

8. The system of claim 7, wherein the processing circuit is further configured to:
determine the second syndrome of the Reed-Solomon codeword based on the first error evaluator polynomial,
wherein the first locator polynomial is updated to the second locator polynomial using a Berlekamp-Massey (BM) algorithm and based on the second syndrome.

9. A method for hard decision decoding of Reed-Solomon codes by a processing circuit comprising a Chien search subcircuit and a Forney subcircuit, the method comprising:
receiving a Reed-Solomon codeword over a channel, the Reed-Solomon codeword comprising a plurality of symbols;
constructing a first locator polynomial for the Reed-Solomon codeword to identify locations of erasures in the Reed-Solomon codeword;
determining a first syndrome of the Reed-Solomon codeword;
calculating a first error evaluator polynomial from the first syndrome and the first locator polynomial;
performing error detection based on the first error evaluator polynomial to detect a presence of errors in the Reed-Solomon codeword; and
when the presence of errors in the Reed-Solomon codeword is not detected in the error detection, bypassing, by the Chien search subcircuit, performing a Chien search and proceed to completing, by the Forney subcircuit, decoding of the Reed-Solomon codeword or,
when the presence of errors in the Reed-Solomon codeword is detected in the error detection, performing, by the Chien search subcircuit, the Chien search before completing, by the Forney subcircuit, decoding of the Reed-Solomon codeword.

10. The method of claim 9, further comprising:
determining a second syndrome of the Reed-Solomon codeword based on the first error evaluator polynomial; and
when the presence of errors in the Reed-Solomon codeword is detected in the error detection, updating the first locator polynomial to a second locator polynomial before completing decoding of the Reed-Solomon codeword, wherein the first locator polynomial is updated to the second locator polynomial using a Berlekamp-Massey (BM) algorithm and based on the second syndrome.

11. The method of claim 9, further comprising:
when the presence of errors in the Reed-Solomon codeword is not detected in the error detection, bypassing updating the first locator polynomial and proceed to completing decoding of the Reed-Solomon codeword; and
when the presence of errors in the Reed-Solomon codeword is detected in the error detection, updating the first locator polynomial to a second locator polynomial before completing decoding of the Reed-Solomon codeword.

12. The method of claim 11, wherein the Chien search is performed with the second locator polynomial, and wherein the second locator polynomial has a power lower than the first locator polynomial in at least one instance.

13. The method of claim 12, further comprising:
calculating a first error evaluator polynomial based on the first locator polynomial and the first syndrome before performing the error detection; and
performing the error detection based on the first error evaluator polynomial.

14. The method of claim 13, further comprising:
when the presence of errors in the Reed-Solomon codeword is detected in the error detection, calculating a second error evaluator polynomial, wherein the second error evaluator polynomial has a power higher than the first error evaluator polynomial;
when the presence of errors in the Reed-Solomon codeword is detected in the error detection, calculating a third locator polynomial; and
when the presence of errors in the Reed-Solomon codeword is detected in the error detection, completing decoding of the Reed-Solomon codeword using the second error evaluator polynomial and the third locator polynomial.

15. The method of claim 14, further comprising:
determining a second syndrome of the Reed-Solomon codeword based on the first error evaluator polynomial.

16. The method of claim 15, further comprising:
determining the second syndrome of the Reed-Solomon codeword based on the first error evaluator polynomial, wherein the first locator polynomial is updated to the second locator polynomial using a Berlekamp-Massey (BM) algorithm and based on the second syndrome.

17. A decoding device for hard decision decoding of Reed-Solomon codes, the decoding device comprising:
an interface that receives a Reed-Solomon codeword over a channel, the Reed-Solomon codeword comprising a plurality of symbols;
a processing circuit comprising at least one decoder that implements a process for decoding the Reed-Solomon codeword, wherein the processing circuit is configured to:
construct a first locator polynomial for the Reed-Solomon codeword to identify locations of erasures in the Reed-Solomon codeword;
determine a first syndrome of the Reed-Solomon codeword;
calculate a first error evaluator polynomial from the first syndrome and the first locator polynomial;
perform error detection based on the first error evaluator polynomial to detect a presence of errors in the Reed-Solomon codeword, or
when presence of errors in the Reed-Solomon codeword is not detected in the error detection, bypassing, by the at least one decoder, updating the first locator polynomial and proceed to completing decoding of the Reed-Solomon codeword; and
when the presence of errors in the Reed-Solomon codeword is detected in the error detection, updating, by the at least one decoder, the first locator polynomial to a second locator polynomial before completing decoding of the Reed-Solomon codeword.

18. The decoding device of claim 17, wherein the processing circuit is further configured to:
determine a second syndrome of the Reed-Solomon codeword based on the first error evaluator polynomial,
wherein the first locator polynomial is updated to the second locator polynomial using a Berlekamp-Massey (BM) algorithm and based on the second syndrome.

19. The decoding device of claim 17, wherein the processing circuit is further configured to:
when the presence of errors in the Reed-Solomon codeword is not detected in the error detection, bypass performing a Chien search and proceed to completing decoding of the Reed-Solomon codeword; and
when the presence of errors in the Reed-Solomon codeword is detected in the error detection, perform the Chien search before completing decoding of the Reed-Solomon codeword.

20. The decoding device of claim 19, wherein the Chien search is performed with the second locator polynomial, and wherein the second locator polynomial has a power lower than the first locator polynomial in at least one instance.

* * * * *